United States Patent [19]

Miyasaka

[11] Patent Number: 4,481,526
[45] Date of Patent: Nov. 6, 1984

[54] SEMICONDUCTOR DEVICE
[75] Inventor: Kiyoshi Miyasaka, Yokohama, Japan
[73] Assignee: Fujitsu Limited, Kawasaki, Japan
[21] Appl. No.: 274,542
[22] Filed: Jun. 17, 1981
[30] Foreign Application Priority Data Jun. 17, 1980 [JP] Japan ................................. 55-81953

[51] Int. Cl.³ ................... H01L 25/04; H01L 23/28; H01L 29/34; H01L 27/12
[52] U.S. Cl. ...................................... 357/84; 357/29; 357/41; 357/23; 357/52; 357/49; 357/72; 365/149
[58] Field of Search ...................... 357/84, 29, 41, 23, 357/52, 49, 72; 365/149

[56] References Cited

FOREIGN PATENT DOCUMENTS 55-68659   5/1980  Japan ................................... 357/29
55-128851 10/1980  Japan ................................... 357/29
2036428    6/1980  United Kingdom .................. 357/29

OTHER PUBLICATIONS

Kulow et al., *IBM Tech. Dis. Bull.*, vol. 22, No. 12, May 1980, pp. 5367-5368, "Enhanced ... Process".
Electronics, Sep. 25, 1980, pp. 39-40, Posa, ed.
IBM Tech. Disc. Bull., vol. 22, No. 4, Sep. 1979, p. 1398, W. C. Ward, "Alpha particle shield".
Electronics, Sep. 11, 1980, pp. 41-42.
Electronics, Jun. 8, 1978, pp. 42-43.
Electronics, Jul. 31, 1980, pp. 103-106, Katto et al.
Electronics, Jul. 31, 1980, p. 33.
IBM Technical Disclosure Bulletin, vol. 22, No. 4, Sep. 1979, pp. 1460-1461, New York (USA); J. A. Brody et al.: "Storage and logic errors in dynamic memory devices due to innate radio-active materials in packaging and wafer", EPC Search Report dated Mar. 30, 1984.

Primary Examiner—Martin H. Edlow
Assistant Examiner—Jerome Jackson
Attorney, Agent, or Firm—Staas & Halsey

[57] ABSTRACT

A semiconductor device comprising memory circuits coated with a resinous film for shielding these circuits from the radioactive rays formed in substrate material. The resinous film is divided into a plurality of portions which are separated from one another and further coats at least memory cells and sense amplifiers. In one of the embodiments a part of the resinous film is removed at the portion of the chip other than said memory cells and sense amplifiers.

12 Claims, 3 Drawing Figures

SEMICONDUCTOR DEVICE

BACKGROUND OF THE INVENTION

This invention relates to a semiconductor device, more particularly to a semiconductor device comprising memory circuits coated with a protective resinous film for shielding the circuits against radioactive rays and thereby eliminating soft errors caused by the rays.

A semiconductor device, on which memory cells, etc., are fabricated, is usually enclosed within a ceramic or plastic package. It is known that ceramic materials are contaminated with uranium and thorium in an amount equal to several parts per million. Plastic package materials include ceramic fillers which are also contaminated with radioactive materials.

The radioactive materials emit radioactive rays. Such irradiation, particularly an α-particle, induces pairs of electrons and holes in the substrate. Holes are mobile vacancies in the electronic valence structure of a semiconductor that act like a positive electron charge with a positive mass. The irradiation is apt to change the potential of the storage capacitor and circuit-nodes. Consequently, this potential change causes faulty operation of memory circuits, usually called soft errors, particularly in the case of dynamic random access memories.

In order to eliminate such faulty operation of memory circuits, a protective film made of a radiation shielding resin, such as polyimide and silicone, is generally applied on the surface of a semiconductor chip. For example, when the energy of the emitting α-particle is assumed to be 5 MeV, the resinous film must have a thickness of from 30 to 50 μm in order to inhibit the penetration of α-particles. This protective film is thicker than other films applied on a semiconductor device, such as silicon oxide film, phospho-silicate glass and so on.

When the resinous material is cured on the substrate, it undergoes a large strain due to the contraction of its volume. In addition, the difference in thermal expansion between the protective resinous material and the substrate material, e.g., polyimide versus silicon, further affects mechanical strain, especially when the chip is enclosed in a ceramic package at a temperature of about 450° C. Because the coefficients of thermal expansion of polyimide, silicone and silicon are $27 \times 10^{-6}/°C$. $50 \times 10^{-6}/°C$. and $2.3 \times 10^{-6}/°C$., respectively, the expansion of the coating resin is at least ten times larger than that of the substrate. This strain is still further increased by an increase in the thickness and coating area of the protective film.

Japanese Patent Application Laid-open No. 55-128851 of J. Shirasu et al. discloses a semiconductor device prepared from a silicon wafer which has all its regions coated by a protective resinous film except the bonding pads region and the scribing region. However, this patent application does not teach dividing the protective resinous film into several portions so as to decrease the area of a single coating portion and, consequently, reduce the amount of the strain resulting after curing between the protective film and the substrate.

SUMMARY OF THE INVENTION

It is an object of the present invention to eliminate soft errors of a semiconductor device caused by irradiation within the substrate.

It is another object of the present invention to reduce mechanical strain which may result between the protective film and the substrate in a semiconductor device.

Other objects and advantages of the present invention will further become apparent from the following description.

According to the present invention, there is provided a semiconductor device comprising a chip made of a semiconductor substrate, in which memory circuits including memory cells and sense amplifiers are fabricated, and wherein a resinous film is formed on part of said chip for shielding the memory circuits from the radioactive rays found in the substrate, the film is divided into a plurality of portions, said portions being separated from one another, and finally the film coats at least said memory cells and sense amplifiers.

It is preferable that those elements which have high resistivity against irradiation of radioactive rays, such as decoders and clock generators, be fabricated in the areas in which said portions of said resinous film are separated from one another. It is also preferable that said resinous film not be applied to bonding pads. Besides coating the substrate, the resinous film should most preferably only be applied on said memory cells and said sense amplifiers.

As another aspect of the present invention, there is provided a semiconductor device comprising a chip made of a semiconductor substrate, in which memory cells and sense amplifiers are fabricated, and wherein a resinous film is formed on said chip coating at least said memory cells and sense amplifiers, then removing a part of said resinous film at the portion not containing said memory cells and sense amplifiers, whereby the strain between said resinous film and substrate is minimized.

It is also preferable that said resinous film is made of polyimide or silicone.

DETAILED DESCRIPTION OF THE PREFERRED EMBODIMENT

Figure 1:
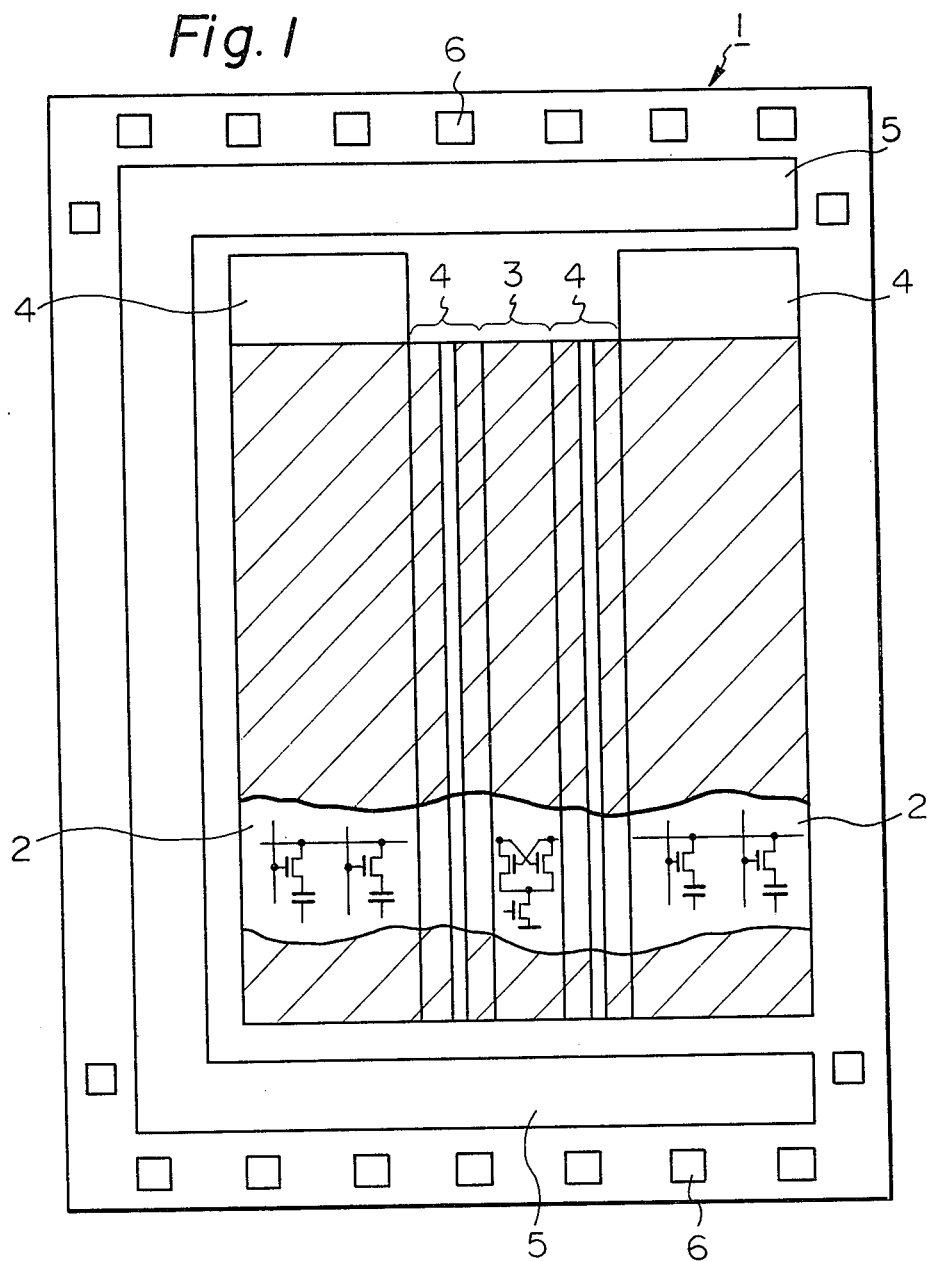
FIG. 1 is a plan view of an embodiment of the semiconductor device of the present invention.

The present invention will now be described in detail referring to the drawings.

In a semiconductor device 1, the areas of memory cells 2 or sense amplifiers 3 are covered by individual portions of the protective resinous film (shown as hatched portions) which are separated from one another by the areas where decoders 4 are fabricated. Therefore, each portion of the resinous film which covers the region 2 or 3 has a relatively small area. The resinous film does not cover the areas where decoders 4 and peripheral circuits, such as clock generators and I/O buffers 5 and bonding pads 6 are fabricated.

These portions of the resinous film may be easily formed by a usual method, such as masked screen printing and photolithography followed by etching using hydrazine $N_2H_4$.

Figure 2:
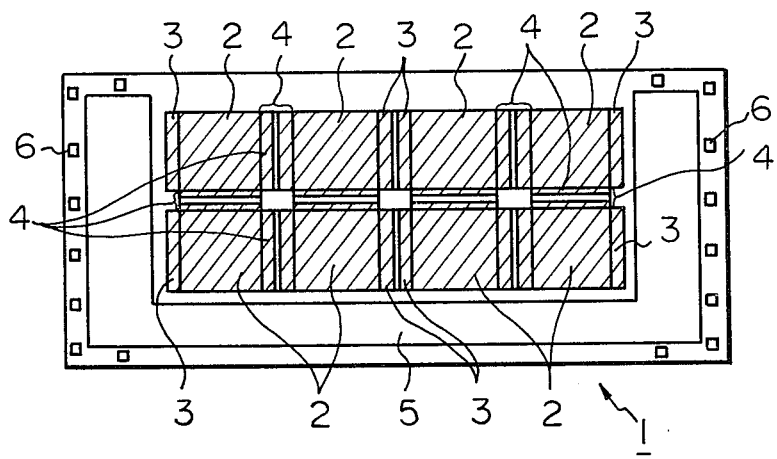
FIG. 2 is a plan view of another embodiment of the semiconductor device of the present invention.

The chip sizes of the semiconductor devices, for example, shown in FIGS. 1 and 2 are 5.3 mm×2.8 mm and 6.5 mm×3.4 mm, respectively. However, the sizes of individual portions of the resinous films are as small as 3.9 mm×0.8 mm and 1.2 mm×1.2 mm, respectively.

Although the thickness of the resinous film is relatively large, e.g., 50 μm, the contraction during curing and the thermal expansion of the coating resin cause relatively small strain between the coating resinous film and the substrate and, consequently, the reliability of the semiconductor device is improved.

Figure 3:
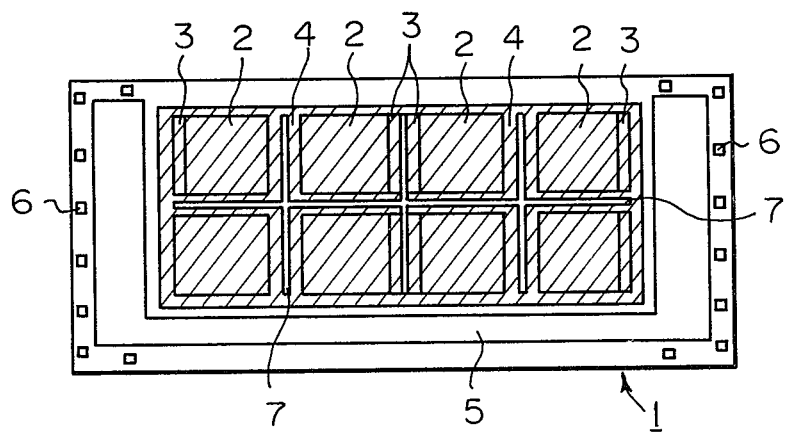
FIG. 3 is a plan view of another embodiment of the semiconductor device of the present invention.

In FIG. 3, the resinous film (shown as the hatched portion) is not divided into a plurality of portions. However a part of the resinous film is removed at the portion 7 where circuits, such as decoders 4, other than memory cells 2 and sense amplifiers 3 are fabricated. In this embodiment, the strain between the resinous film and substrate also is minimized.

Thus, the semiconductor devices according to the present invention can inhibit the penetration of radioactive rays to irradiation sensitive members, such as memory cells and sense amplifiers, so that they do not suffer from the so-called soft errors during operation.

I claim:

1. A semiconductor device comprising: a chip made of a semiconductor substrate and memory circuits, including memory cells and sense amplifiers, fabricated in said chip; and a resinous film formed on said chip for shielding radioactive rays, said film being divided into a plurality of portions, wherein said portions are separated from one another for forming at least one separation area, and coat at least said memory cells and said sense amplifiers.

2. A semiconductor device according to claim 1, further comprising: elements having high resistivity to irradiation of radioactive rays being fabricated in the at least one separation area.

3. A semiconductor device according to claim 1, further comprising: bonding pads fabricated in said chip, and wherein said resinous film is not applied on said bonding pads.

4. A semiconductor device according to claim 1, wherein said resinous film is applied only on said memory cells and said sense-amplifiers.

5. A semiconductor device according to claim 1, 2, 3 or 4, wherein said resinous film is made of polyimide.

6. A semiconductor device, comprising: a chip made of a semiconductor substrate and memory cells and sense amplifiers fabricated in said chip; and a resinous film formed on said chip, said resinous film coating at least said memory cells and sense amplifiers, and having a part of said resinous film removed for forming a removed area at the portion of the chip other than said memory cells and sense amplifiers for substantially dividing said resinous film, whereby the strain between said resinous film and substrate is small.

7. A semiconductor device according to claim 6, wherein said resinous film is made of polyimide.

8. A semiconductor device according to claim 2, wherein said high resistivity elements include decoders, clock generators, and Input/Output buffers.

9. A semiconductor device according to claim 1, 2, 3, 4 or 8, wherein said resinous film is made of silicone.

10. A semiconductor device according to claim 6, wherein said resinous film is made of silicone.

11. A semiconductor device, comprising: a chip made of a semiconductor substrate; radioactive-sensitive elements and non-radioactive-sensitive elements fabricated in said chip; and a resinous film formed on said chip for shielding radioactive rays, said film being divided into a plurality of portions, wherein said portions are separated from one another for forming at least one separation area, and coating at least said radioactive-sensitive elements.

12. A semiconductor device according to claim 8, wherein said resinous film is made of polyimide.

* * * * *